United States Patent
Higashi

(10) Patent No.: US 6,717,240 B2
(45) Date of Patent: Apr. 6, 2004

(54) FABRICATION METHOD AND WAFER STRUCTURE OF SEMICONDUCTOR DEVICE USING LOW-K FILM

(75) Inventor: Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/418,073

(22) Filed: Apr. 18, 2003

(65) Prior Publication Data

US 2003/0199125 A1 Oct. 23, 2003

Related U.S. Application Data

(62) Division of application No. 10/100,006, filed on Mar. 19, 2002, now Pat. No. 6,593,250.

(30) Foreign Application Priority Data

Sep. 3, 2001 (JP) .................................. 2001-266264

(51) Int. Cl.$^7$ .............................................. H01L 21/00
(52) U.S. Cl. ...................... 257/632; 257/635; 257/638; 257/642
(58) Field of Search .................. 257/629–651

(56) References Cited

U.S. PATENT DOCUMENTS 5,549,786 A * 8/1996 Jones et al. .................. 438/723
5,618,380 A * 4/1997 Siems et al. .................. 438/14

* cited by examiner

*Primary Examiner*—H. Jey Tsai
(74) *Attorney, Agent, or Firm*—Oblon, Spivak, McClelland, Maier & Neustadt, P.C.

(57) ABSTRACT

In a semiconductor device fabrication method, a first low dielectric constant film having a specific dielectric constant of k less than 3 (k<3) is formed over a wafer so that an edge position of the first low dielectric constant film aligns with a first position along the circumference of the wafer. Then, a first protection layer having a gas permeability lower than that of the first low dielectric constant film is formed over the first low dielectric constant film and the wafer so that an edge of the first protection layer aligns with a second position that is located outside the first position. Then, a second low dielectric constant film having a specific dielectric constant of k less than 3 (k<3) is formed over the first protection layer so that an edge of the second low dielectric constant film is located at the first position.

20 Claims, 8 Drawing Sheets

ILD FILM DEPOSITION
(SPIN COATING)

ILD EDGE-CUT POSITION

RESIST EDGE EXPOSURE

EDGE CUT REGION

RESIST DEVELOPMENT
(PATTERN FORMATION & EDGE CUT)

EDGE CUT REGION   PATTERN 39

FABRICATION METHOD AND WAFER STRUCTURE OF SEMICONDUCTOR DEVICE USING LOW-K FILM

This patent application is a divisional of parent U.S. application Ser. No. 10/100,006 filed Mar. 19, 2002, now U.S. Pat No. 6,593,250 and is based upon and claims the benefit of the earlier filing date of Japanese Patent Application No. 2001-266264 filed Sep. 3, 2001, the entire contents of which are incorporated herein by reference.

BACKGROUND OF THE INVENTION

The present invention relates to fabrication of semiconductor devices. In particular, it relates to a semiconductor device fabrication method and wafer structure, in which low-k (low dielectric constant) films are used as interlevel dielectrics in a multilayered structure.

Along with increasingly high integration and miniaturization of integrated circuits, low dielectric constant (low-k) films have come to be used as interlevel dielectrics in attempt to decrease parasitic capacitance between interconnects. In particular, in generations after the 0.25 μm design rule, demand has grown for a material with reduced specific dielectric constant k that is smaller than 3 (k<3), from the standpoint of improving device operation speed.

Conventionally, interlevel dielectrics with a k value of approximately 4 to 5 are used, which are formed for example using chemical vapor deposition (CVD). CVD process allows the density of the interlevel dielectric film to be relatively high, and therefore, air permeability is low. Accordingly, undesirable increase in dielectric constant of multilevel dielectrics can be prevented simply by forming a passivation layer with a low permeability (e.g., SiN layer) after all of the multi-level interconnects have been formed.

However, a low-k film having a small k value generally has a low film density, and is thus vulnerable to the effects of the atmosphere. When the k value is less than 3 (k<3), it becomes easier for the air to penetrate into the film. If the film absorbs moisture within the air that has penetrated, the normally low dielectric constant of the film is undermined. Accordingly, with a multilayered structure using low-k films 103 and 105 such as shown in FIG. 1A, it is necessary to perform degassing for each low-k film and thereafter, cover the low-k film 103 with air blocking protection film 104 to shut out the air.

Even if the top surface of each low-k film is covered with an air blocking protection film, the side faces of the low-k films 103, 105 along the outer circumference of the wafer are exposed if not enough care is given to the edge portion of the wafer 101. In general, edge-cut process is carried out for the purpose of preventing dust from being produced due to undesirable contact between the wafer carrier (or the wafer cassette) and the films such as photoresist films or insulating films formed over the wafer edge. Accordingly, the edges of the low-k films and the air blocking protection films are cut off at the position indicated by the arrow "a" along the outer circumference of the wafer 101, as illustrated in FIG. 1B. In this case, if care is not taken with the sides of the low-k films 103, 105, and 109, the specific dielectric constant escalates due to the penetration of the air from the sidewalls.

Therefore, in recent years, it has been proposed to set the respective edge-cut positions for the low-k films progressively further out for each subsequently higher film, as shown in FIGS. 2A and 2B. More specifically, as shown in FIG. 2A, the edge of first low-k film 103 is cut at position "a", and the top surface and sidewall thereof are covered with the air blocking film 104. Second low-k film 105 is then formed over the wafer 101 and the air blocking film 104, and the edge thereof is cut at position a' located outside the air blocking protection film 104. Then, as shown in FIG. 2B, second air blocking film 107 is formed covering the upper surface and sidewall of the second low-k film 105. Third low-k film 109 is formed over the second air blocking film 107, and the edge-cut position is set at position a" yet further outward. In FIGS. 2A and 2B, arrow "b" indicates the edge-cut position of the photoresist used when forming interconnects 102 and interlevel interconnects 106.

In this manner, by extending the layered structure towards the outside while covering the upper surface and sidewalls of each subsequent low-k film with an air blocking protection film, it is possible to prevent penetration of the air. However, considering the fact that semiconductor devices are becoming increasingly multilayered, the edge-cut position of the first low-k film must be set inward into the wafer. If the edge-cut position is set inward, the available area for chips (i.e., the effective chip area) becomes smaller. Reduction of the effective chip area becomes more noticeable as the number of layers deposited increases. With existing techniques, since the edge-cut position is spaced approximately 0.5 mm outward for each subsequent layer, in the case of fabricating a chip with ten layers, the edge (circumference) of the first low-k film must be set at least 5 mm inside the regular edge position.

In addition, as the edge-cut position of the respective low-k films extends outward, it also becomes necessary to shift the edge-cut position of the respective resists used in the photo exposure process (PEP) for patterning interconnects 102 and 106 outward. If the edge-cut position a" of the upper low-k film 109 is further outward than the edge-cut position "b", the periphery of the air blocking protection film 110 is etched at position b during PEP, in which the resist (not shown) deposited on the air blocking film 110 is delineated into an interconnect mask pattern. In this case, the side of the low-k film 109 is left exposed.

In general, edge cut position b of a resist during PEP is fixed, because moving the PEP edge-cut position outward for each layer would affect the mask design and mask fabrication process, causing complications in the entire manufacture processes of semiconductor devices. It has been desired, in a case of using a low-k film of k<3 as interlevel dielectric, to maintain a sufficiently low dielectric constant using a simple technique, without reducing the effective area of the chip taking the PEP.

SUMMARY OF THE INVENTION

In the first aspect of the invention, a semiconductor device fabrication method is provided. With this method, (a) a first low dielectric constant film having a specific dielectric constant of k less than 3 (k<3) is formed over a wafer so that an edge position of the first low dielectric constant film aligns with a first position along the circumference of the wafer;

(b) a first protection layer having a gas permeability lower than that of the first low dielectric constant film is formed over the first low dielectric constant film and the wafer so that an edge of the first protection layer aligns with a second position that is located outside the first position; and (c) a second low dielectric constant film having a specific dielectric constant of k less than 3 (k<3) is formed over the first protection layer so that an edge of the second low dielectric constant film is located at the first position.

In the second aspect of the invention, a semiconductor device fabrication method is provide, which comprises:
(a) forming a first low dielectric constant film having a specific dielectric constant of k less than 3 (k<3) over a wafer;
(b) cutting an edge of the first low dielectric constant film at a first edge cut position along the circumference of the wafer;
(c) covering the first low dielectric constant film and the wafer with a first protection film having a gas permeability lower than that of the first low dielectric constant film;
(d) cutting an edge of the first protection film at a second edge cut position that is located outside the first edge cut position;
(e) forming a second low dielectric constant film having a specific dielectric constant of k less than 3 (k<3) over the first protection layer; and
(f) cutting an edge of the second low dielectric constant film at the first edge cut position.

In the third aspect of the present invention, a wafer structure is provided. This wafer structure includes a wafer; a first low dielectric constant film placed over the wafer, with an edge thereof located at a first position along the circumference of the wafer; a first protection film positioned over the first low dielectric constant film) with an edge thereof located at a second position which is located outside the first position; and a second low dielectric constant film placed over the first protection layer, with an edge thereof located at the first position.

In the fourth aspect of the invention, a wafer structure includes (a) a wafer; (b) a plurality of low dielectric constant films deposited over the wafer, each dielectric constant film having an edge position, and at least two of the edge positions of the low dielectric constant films being approximately aligned with one another; and (c) an air blocking protection film covering each of the low dielectric constant films with an edge thereof positioned at a substantially fixed position located outside the edge position of the corresponding low dielectric constant film.

DETAILED DESCRIPTION OF THE INVENTION

The present invention will now be described in detail based upon examples of semiconductor device fabrication methods and wafer structures, which prevent penetration of the air into the low-k films while maintaining a maximum effective chip area. The edge cut positions of the low-k films formed over a wafer are set inside the edge cut positions of the PEP resist. In addition, the edge cut positions of at least two of the low-k films are kept at a substantially fixed position.

In this specification, expressions such as "over the wafer", "above the layer, or on the film" simply denote a relative positional relationship with respect to the surface of the base layer, regardless of the existence of intermediate layers. Accordingly, these expressions may indicate not only the direct contact of layers, but also, a non-contact state of one or more laminated layers.

<First Embodiment>

FIGS. 3A through 3F show an example of a semiconductor device fabrication process according to the first embodiment of the invention. This embodiment is preferably applicable to, in particular, formation of multilevel interconnects on a wafer, using a low-k material with a specific dielectric constant of k less than 3 (k<3) as the interlevel dielectric throughout the semiconductor fabrication process.

In this embodiment, the edge cut positions of low-k dielectric films are set in alignment with a substantially fixed position, which is referred to as "first edge cut positions", regardless of how many layers of interlevel dielectric are deposited. Also, the edge cut position of resist used in the photo exposure process (PEP) to form interconnect patterns on the respective low-k films is kept at a substantially a fixed position outward from the first edge cut position. This PEP edge cut position is referred to as "the second edge cut position". In addition, the respective edge positions of the air blocking protection films, which are formed over the respective low-k films in order to protect the low-k films from the air, are aligned with the PEP edge cut position (e.g., the second edge cut position). With this arrangement, the sidewall of each low-k film that has been subjected to edge processing, are covered with the associated air blocking protection film without fail at a substantially fixed position.

Figure 1A:
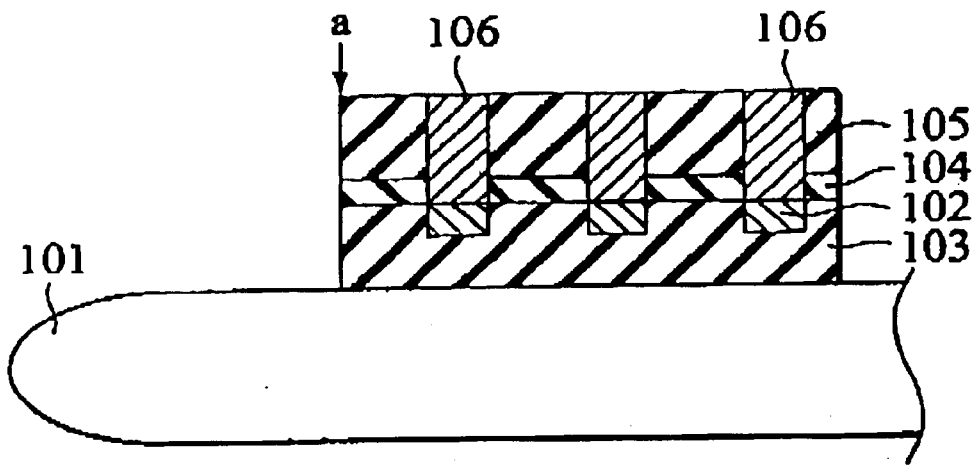
FIGS. 1A and 1B illustrates a conventional multi-level interconnect structure in which interlayer insulating layers are simply replaced with low-k films without edge care.
Figure 1B:
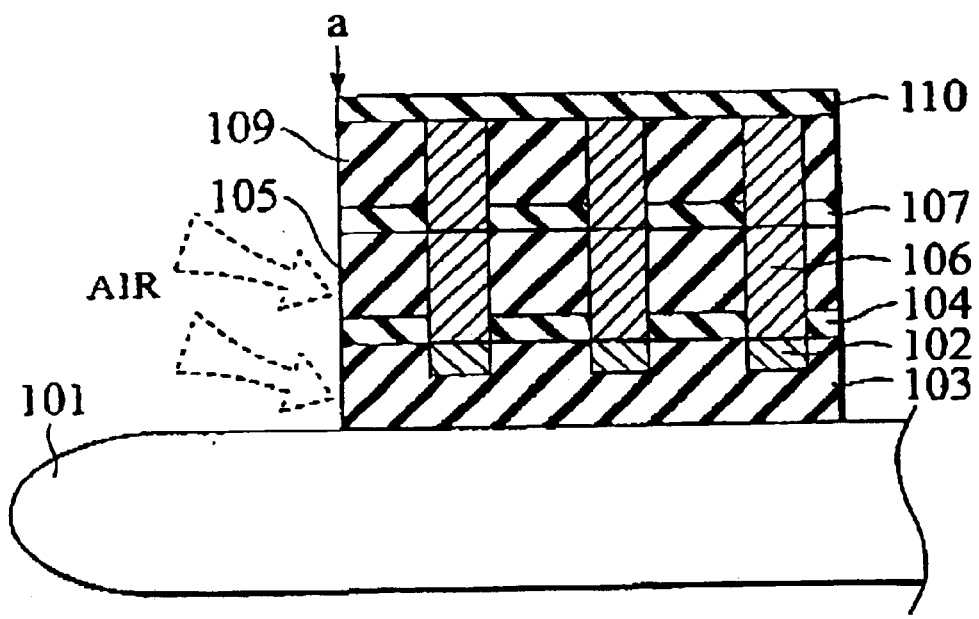
Figure 2A:
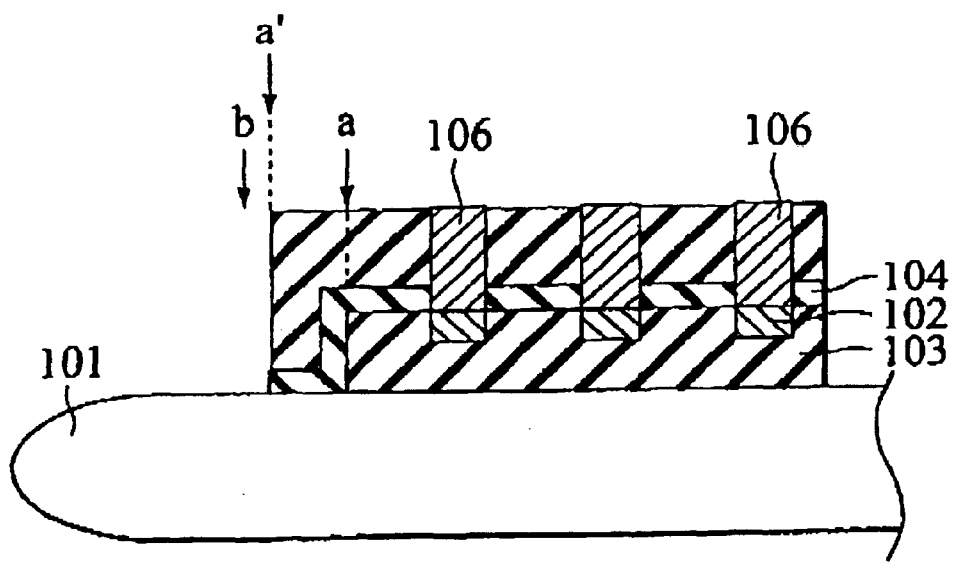
FIGS. 2A and 2B illustrate a known wafer structure in which edge positions are placed progressively further out for each subsequently higher layer so as to protect the sidewalls of the low-k films.
Figure 2B:
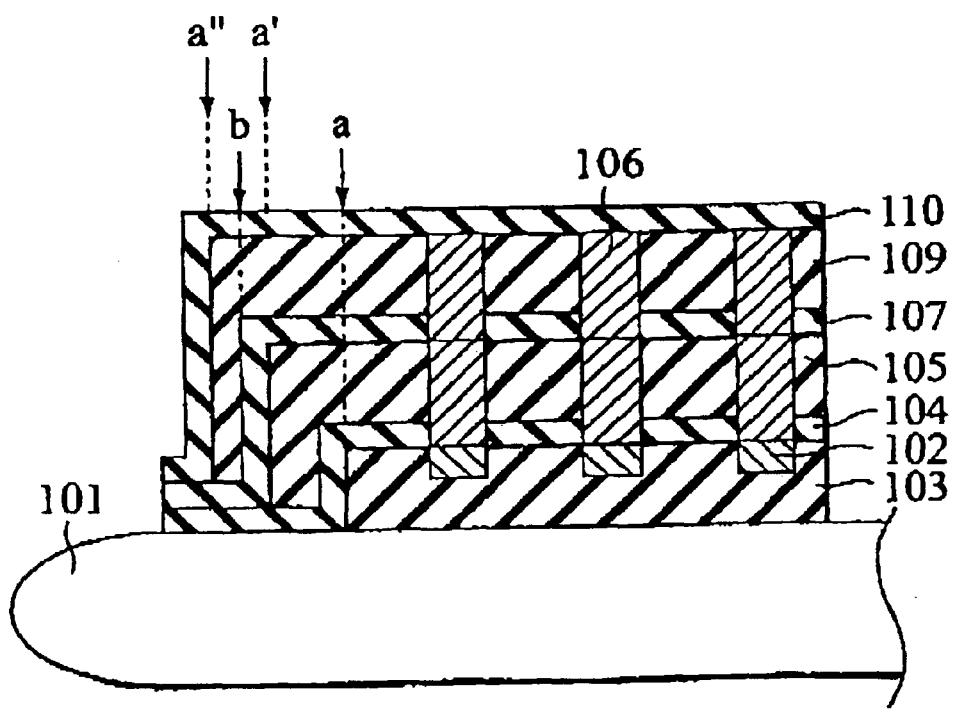
Figure 3A:
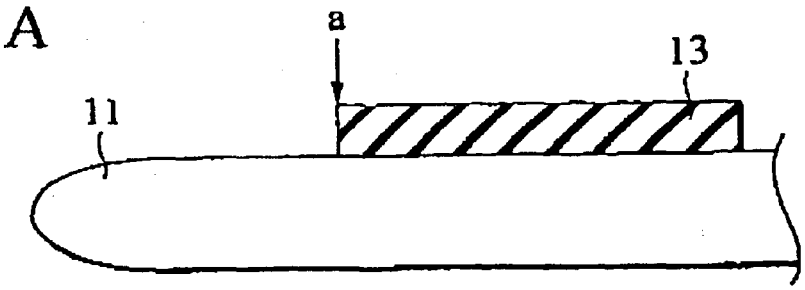
FIGS. 3A through 3F illustrate a fabrication process of a semiconductor device according to the first embodiment of the invention.

To be more precise, as illustrated in FIG. 3A, a low-k film 13 of k<3 is formed on wafer 11 so that the edge position is placed at the position indicated by the arrow "a" (i.e., first edge cut position). The low-k film 13 is formed with, for example, methylsiloxane ($SiO_2$—$CH_3$) by spin coating. However, the invention is not limited to this specific example; low-k film 13 may also be formed using any appropriate polymethylsiloxane, or alternatively, using hydrogensilsesquixane (HSQ), which is an inorganic SOG material having a low dielectric constant.

Figure 4A:
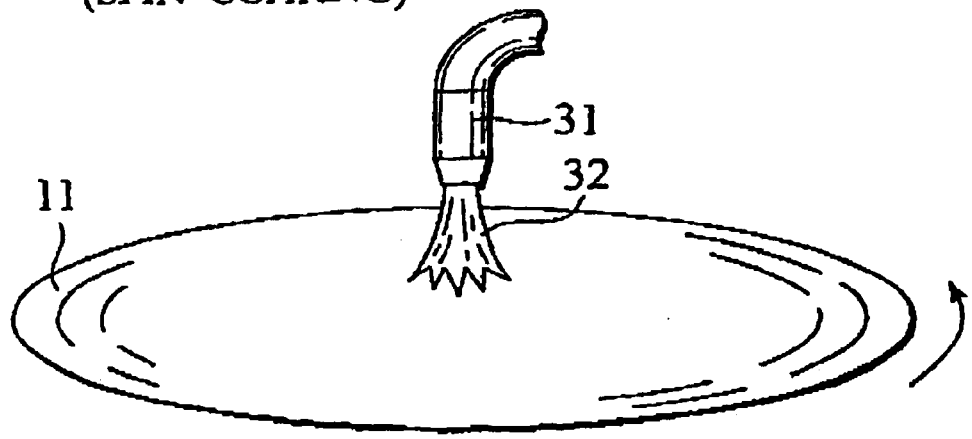
FIGS. 4A and 4B illustrate an example of edge-position control for the low-k films shown in FIG. 3A.
Figure 4B:
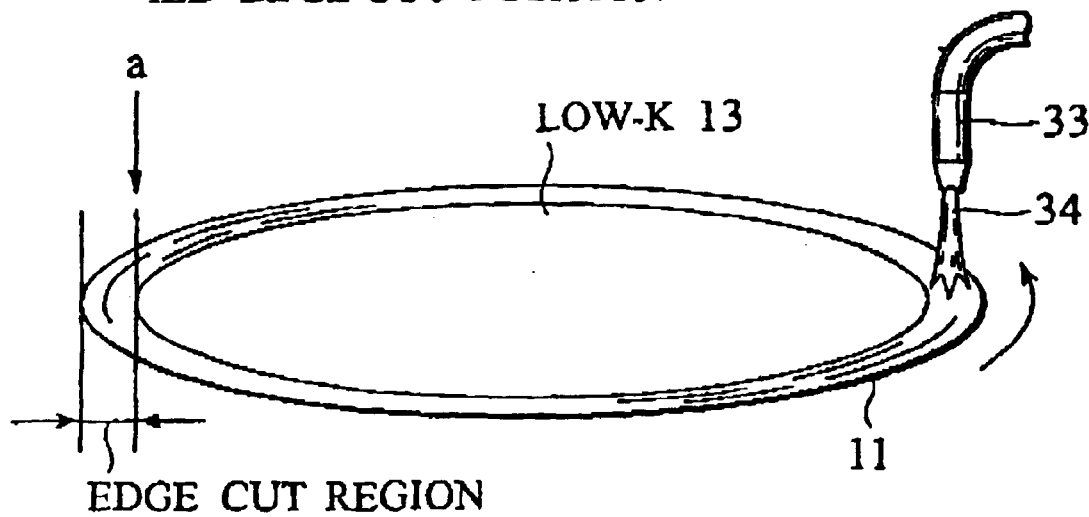

An example of controlling the edge position of low-k film 13 is illustrated in FIGS. 4A and 4B, in which the nozzle position is adjusted during edge rinse. In this case, solvent 32 of an interlevel dielectric (ILD) material where k<3 is seeped from nozzle 31 onto wafer 11, and wafer 11 is rotated to apply it evenly across the entire surface of wafer 11, as shown in FIG. 4A. Thereafter, as shown in FIG. 4B, while rotating the wafer 11, solution (for example, thinner) 34, which dissolves ILD solvent 32, is ejected from nozzle 33 to perform a edge cut at a designated position of wafer 11. The thinner 34 is applied to the periphery of the wafer 11, and it dissolves and removes ILD layer 32 from the region spanning from the wafer rim to the first edge cut position "a".

Figure 3B:
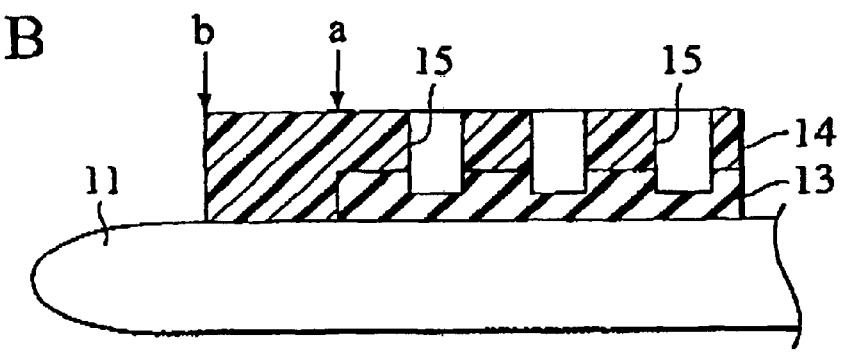
Figure 5A:
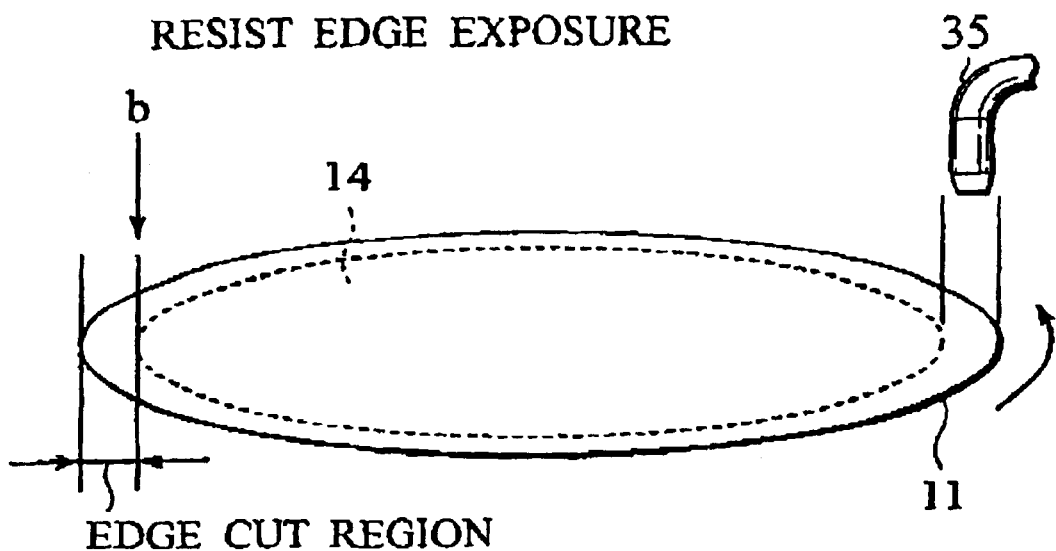
FIGS. 5A and 5B illustrate an example of edge-position control for the resist shown in FIG. 3B.
Figure 5B:
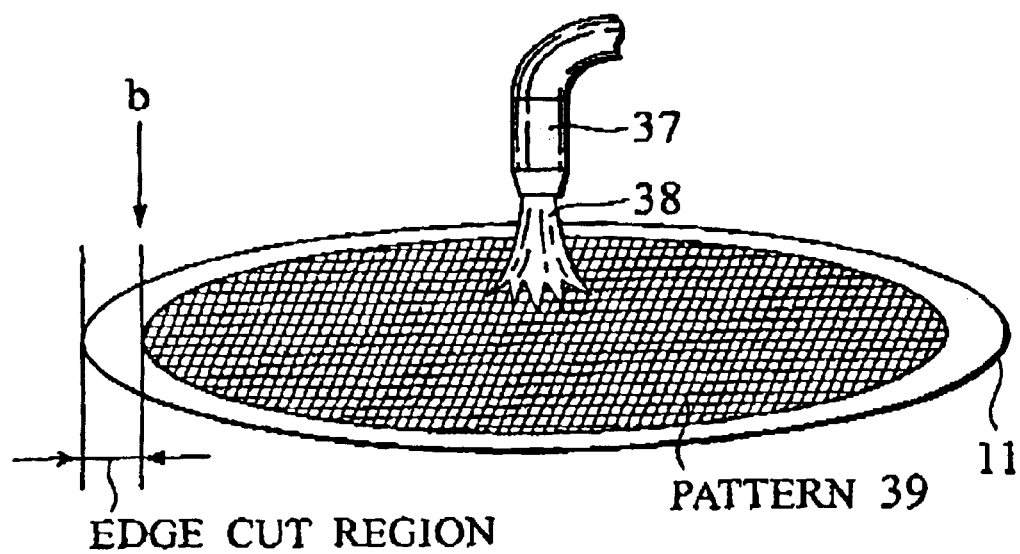

Then, as illustrated in FIG. 3B, photoresist 14 is applied over the low-k film 13 and the wafer 11, and is delineated into a mask pattern by PEP. The edge portion of the photoresist 14 is also cut at the position indicated by the arrow "b" (e.g., the second edge cut position). More specifically, for example as shown in FIG. 5A, a resist solvent is seeped onto the wafer 11 and the low-k film 13, and wafer 11 is rotated to apply the resist 14 evenly across the entire surface. Then, after heat treatment has been performed to stabilize the film of resist 14, the peripheral portion of the resist 14 along the wafer circumference, which is to be removed for a edge cut, is irradiated by ultraviolet light source 35, while rotating the wafer 11. Then, as shown in FIG. 5B, mask pattern (or chip pattern) 39 is exposed onto the resist 14 using a known method. When developer 38 is ejected from nozzle 37, the exposed portion (or the irradiated portion) is dissolved and removed. As a result, the chip pattern is formed on the resist layer 14, and at the same time, the edge is cleared through to the second edge cut position "b". In this example, a positive type resist where the exposed portion is dissolved is used; however, a negative type photoresist may be used to carry out pattern formation and edge cutting. In this case, a reticle having a pattern that hides the wafer edge and the interconnect pattern is used. Using the patterned resist 14 as a mask, the interconnect pattern is transferred into the low-k film 13 by RIE (reactive ion etching).

Figure 3C:
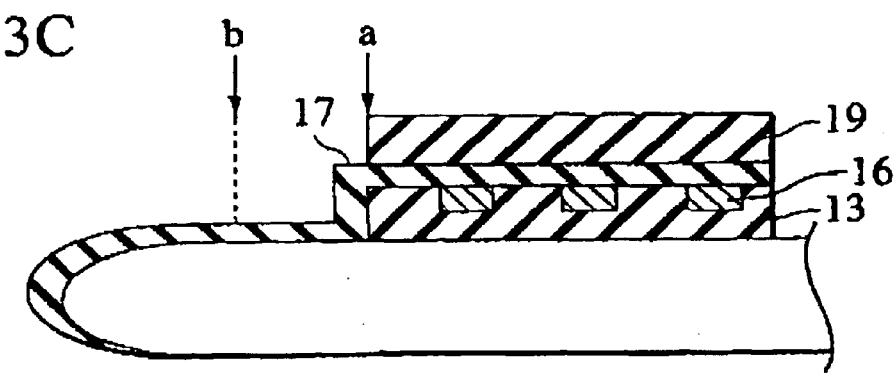

Then, as illustrated in FIG. 3C, resist 14 is removed, and damascene interconnects 16 are formed by filling the interconnect trenches 15 with a metal, such as copper (Cu), using sputtering, plating, or CMP (chemical mechanical polishing). The surface of the low-k film 13 is then polished, and air blocking protection film 17 is formed over the entire surface of the wafer 11 and the low-k film 13 so as to shut out the air. Air blocking protection film 17 is made of, for example, SiN, SiC, SiO, SiOC, SiOF, or SiON using plasma CVD (chemical vapor deposition). It is preferable to carry out high-temperature vacuum annealing and degassing of the low-k film as a pretreatment before the air blocking protection film 17 is formed. By forming the air blocking protection film 17 while continuing to maintain the vacuum, moisture-containing air gaps that may remain within low-k film 13 are eliminated. Then, a second low-k film 19 is spin-coated over the air blocking protection film 17. The edge of the second low-k film 19 is cut at the position of arrow "a" (e.g., the first edge cut position). In order to maximize the effective area for the chips, the edge position of the second low-k film 19 is aligned with the edge position of first low-k film 13 in FIG. 3C. However, as long as the edge of the second low-k film 19 is positioned inside the second edge cut position "b", some misalignment with the first edge cut position "a" is acceptable.

Figure 3D:
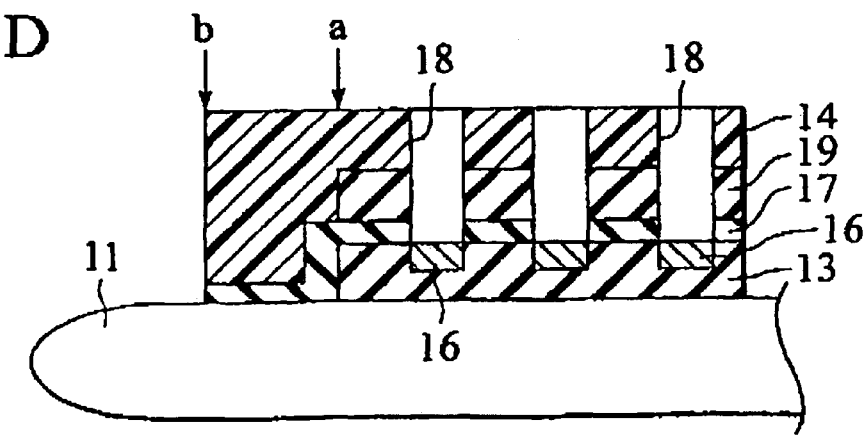

Then, as illustrated in FIG. 3D, photo resist 14 is once again applied over the second low-k film 19, and trench pattern 18 of interlevel interconnect or via holes is formed, as in the process shown in FIG. 3B. To be more precise, prior to the exposure of mask pattern, the edge portion of the resist 14 is exposed to the ultraviolet rays at position "b", as shown in FIG. 5A. After edge cut and developing the mask pattern, trenches 18 are formed in the second low-k film 19 and the first air blocking film 17 by RIE, using the resist 14 as a mask. Since the edge of the resist mask 14 is set to position "b" during PEP, the edge of the first air blocking protection film 17 is brought into alignment with PEP edge cut position "b". During the formation of the trench 18, the sidewalls of both the first and second low-k films 13 and 19 are protected, and therefore, the dielectric constant of the low-k film can be maintained sufficiently low.

Figure 3E:
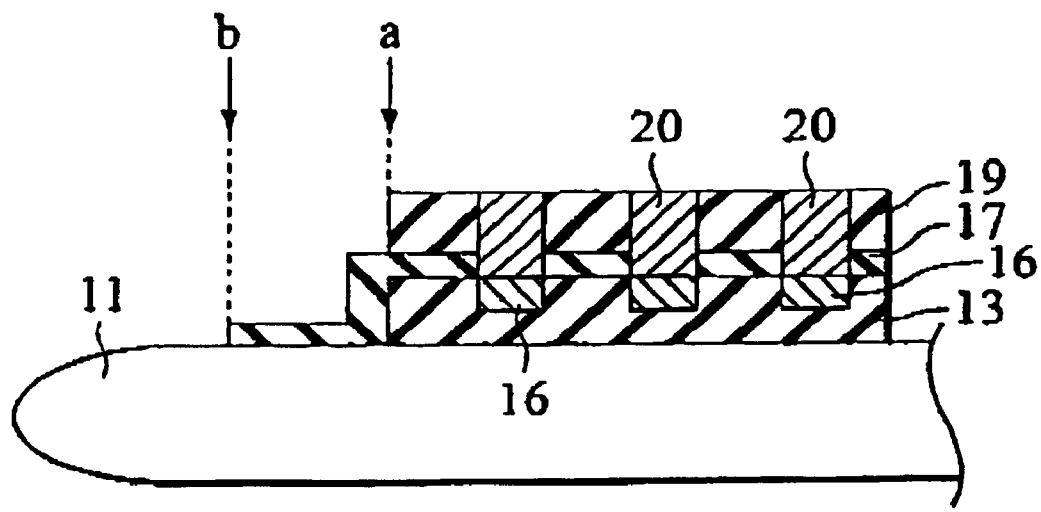

Then, as illustrated in FIG. 3E, the resist 14 is removed, and interlayer interconnects 20 are formed by filling the trenches 18 with a metal, such as Al. The surface is then polished. Throughout the process of FIGS. 3C to 3E, the sidewall of the first low-k film 13 has been protected with the air blocking protection film 17. The second low-k film 19 is also protected until immediately before the unnecessary portion of the Al layer is removed to complete the interlevel interconnects 20. Consequently, there is little chance of air penetrating.

Figure 3F:
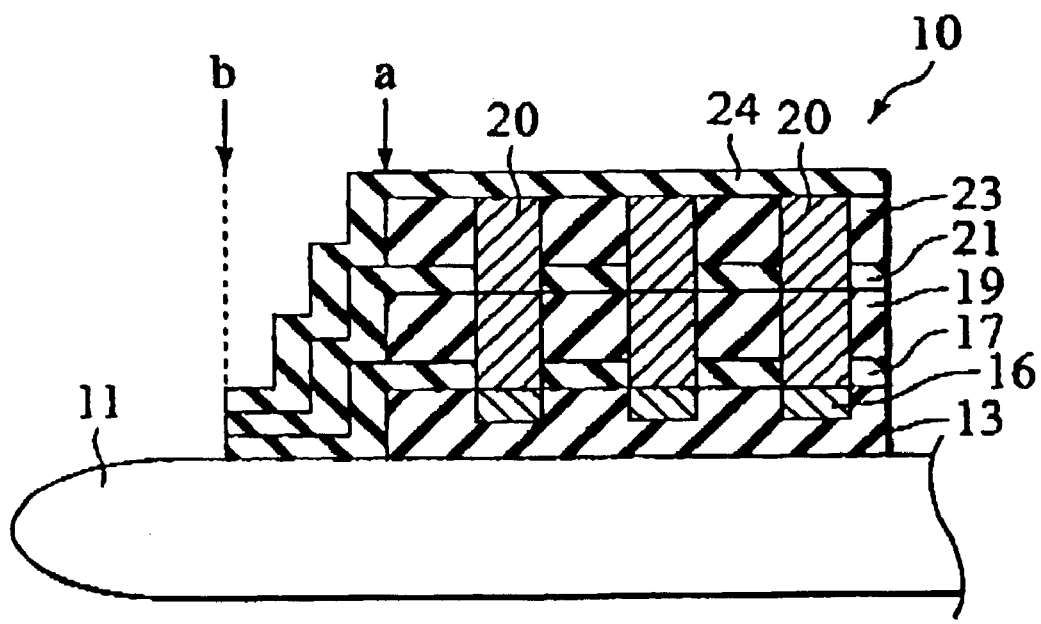

Next, as illustrated in FIG. 3F, the process shown in FIGS. 3C through 3E is repeated. Second air blocking protection film 21 and third low-k film 23 are formed, and a third-level interconnects 20 is formed. Third air blocking protection film 24 is formed after degassing is carried out on the third low-k film 23. If the wafer 11 is further multilayed, the edge of each air blocking protection films is aligned with the edge cut position "b", which agrees with the PEP edge cut position, and the edge of each low-k film is set to substantially the same position inward of the PEP edge cut position.

A wafer fabricated by the above-described process has a structure shown in FIG. 3F. The wafer structure 10 shown in FIG. 3F includes a wafer 11, a first low-k film 13, which is positioned on the wafer 11 with the edge thereof aligned with a first edge cut position "a", a first protection film 17, which covers the first low-k film 13 with the edge thereof aligned with a second edge cut position "b" located outside the first edge cut position "a"; and a second and subsequent low-k films 19, 23, which are positioned on the first protection film 17, with the respective edges thereof aligned with the first edge cut position "a". In the example of FIG. 3F, all of the edge positions of the low-k films 13, 19, 23 are aligned with the first edge cut position "a". However, as long as they are placed inward of the second edge cut position "b", a configuration with at least two of the low-k films aligned is also acceptable.

With the semiconductor device fabrication method and the wafer structure according to the first embodiment, the dielectric constant can be kept low by effectively blocking penetration of air into the low-k films, without reducing the effective chip area. In particular, in the case of a semiconductor device with a multi-level interconnect structure of 10 or more layers, the number of chips per wafer can be greatly increased, in comparison with the method of moving the edge of each subsequent layer of low-k film outward by 0.5 mm.

As a result of maintaining a low dielectric constant, undesirable parasitic capacitance can be prevented and reliability of device operation can be improved.

<Second Embodiment>

FIGS. 6A through 6I illustrate a fabrication process of a semiconductor device according to the second embodiment of the invention. In the second embodiment, a cover film for protecting the low-k film from process damage during CMP or RIE is provided, in addition to air blocking protection films, which protect the low-k films from the air. The edges of both the air blocking protection films and the cover film are approximately aligned with the PEP edge cut position. On the other hand, the edge of each low-k film fall is located at a nearly fixed position and inside the PEP edge cut position.

Figure 6A:
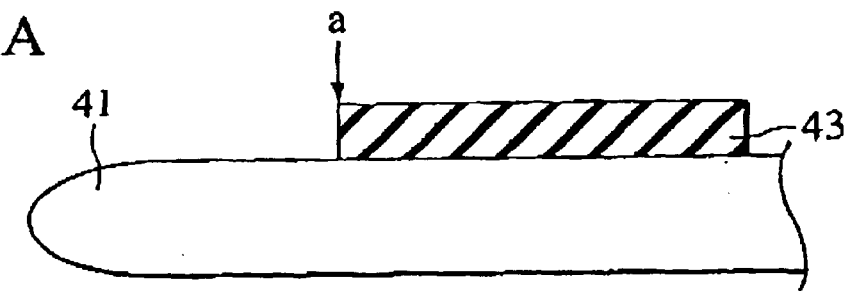
FIGS. 6A through 6I illustrate a fabrication process of a semiconductor device according to the second embodiment of the invention.

To begin with, as illustrated in FIG. 6A, first low-k film 43 is formed on wafer 41 so that the edge thereof aligns with the first edge cut position "a". As in the first embodiment, the edge position of the low-k film 43 is controlled by, for example, adjusting the nozzle position during edge rinse of the low-k film 43 (see FIGS. 4A and 4B).

Figure 6B:
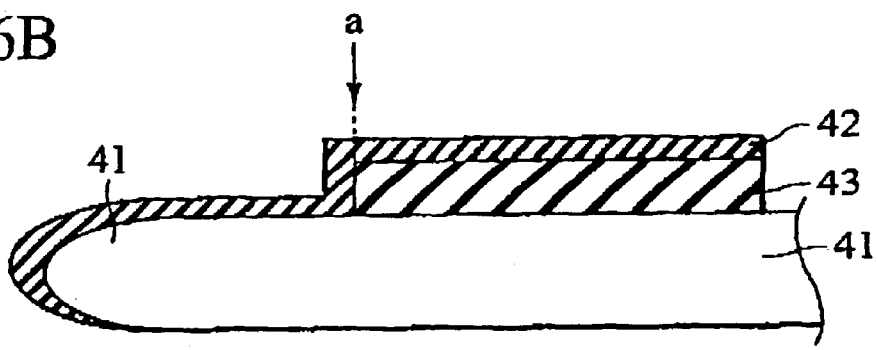

Next, as illustrated in FIG. 6B, cover film 42 is formed over the low-k film 43 and the wafer 41 by CVD for the purpose of protecting the low-k film 43 from process damage of CMP or RIE, which is to be performed in a later process. The cover film 42 does not necessarily have to have an air-blocking capability, and therefore, p-SiO$_2$, p-TEOS or the like is used as the cover film 42.

Figure 6C:
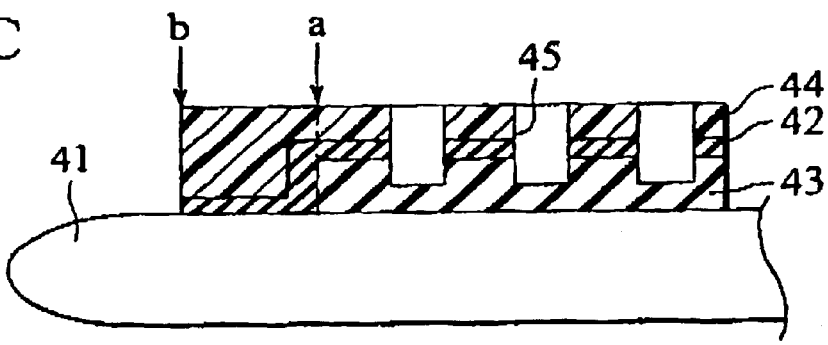

Next, as illustrated in FIG. 6C, resist 44 is applied onto the cover film 42 for pattern formation. The edge of the resist 44 is set to the second edge cut position "b", which is located outside the first edge cut position "a". Interconnect or via holes renches 45 are formed in the fist low-k film 43 using RIE. In the RIE process, the edge of the cover film 42 is also aligned with the second edge cut position "b" using the resist 44 as a mask.

Figure 6D:
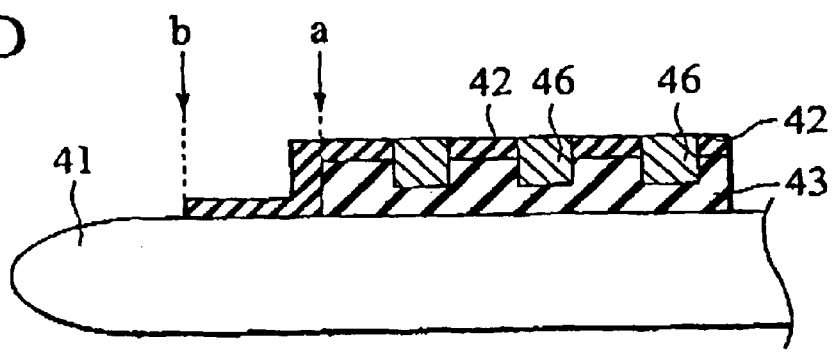

Next, as illustrated in FIG. 6D, resist 44 is removed and, for example, Cu damascene interconnects 46 are formed by sputtering, plating, or other suitable techniques. The surface is then evened by CMP.

Figure 6E:
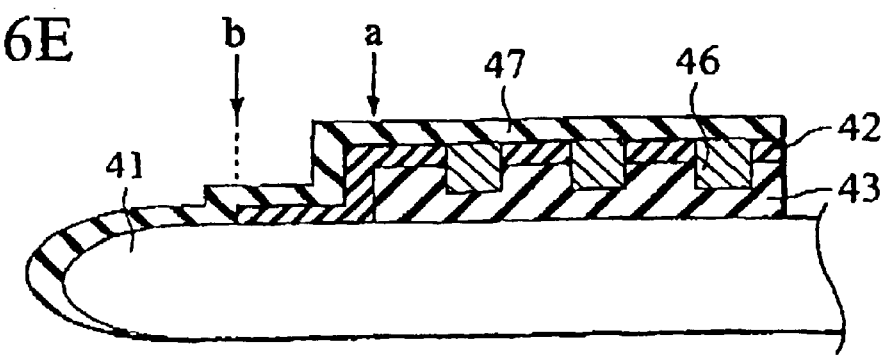

Next, as illustrated in FIG. 6E, air blocking protection film 47 is formed over the cover film 42 by CVD in order to shut out the air from penetrating into the low-k film 43. The air blocking protection film 47 is made of, for example, SiN, SiC, or SiON. As a pretreatment prior to film deposition of air blocking protection film 47, high-temperature vacuum annealing is carried out in-situ as a pre-treatment and the low-k film 43 is degassed prior to the formation of the air blocking protection film 47. The air blocking protection film 47 is formed while continuously maintaining the vacuum, so that the low-k film 43 can be sealed after degassing.

Figure 6F:
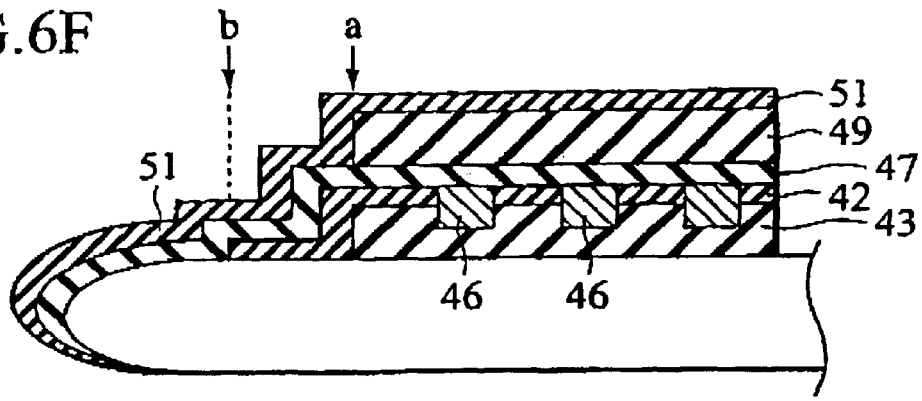

Next, as illustrated in FIG. 6F, second low-k film 49 is formed, with the edge thereof aligned with the first edge cut position "a", and thereupon second cover film 51 is formed.

Figure 6G:
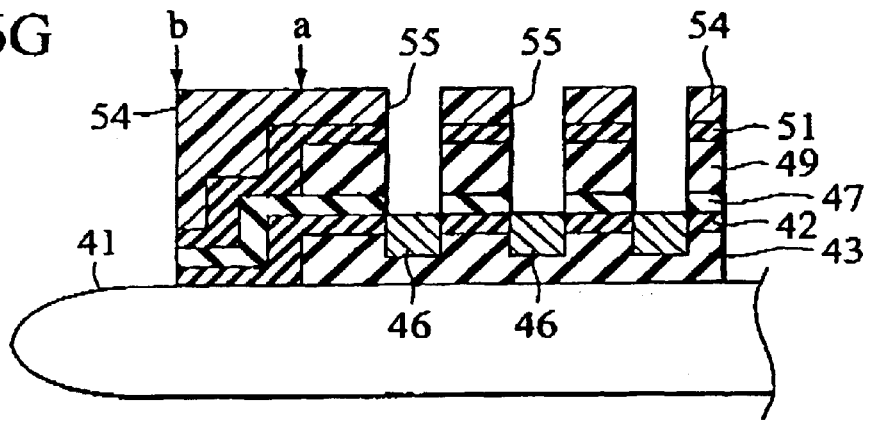

Next, as illustrated in FIG. 6G, resist 54 is applied onto the second cover film 51, and the second edge cut position "b" and the mask pattern are printed on the resist 54 in PEP. Trenches (or via holes) are formed by RIE using the resist pattern 55 as a mask. Since the cover film 51 protects the second low-k film 49, there is little damage to the second low-k film 49 resulting from RIE during the patterning process. During the RIE process, the edge of the first air blocking protection film 47 and that of the second cover film 51 are cut at the PEP edge cut position "b" using the resist 53 as a mask, and thus, they are aligned with the second edge cut position "b".

Figure 6H:
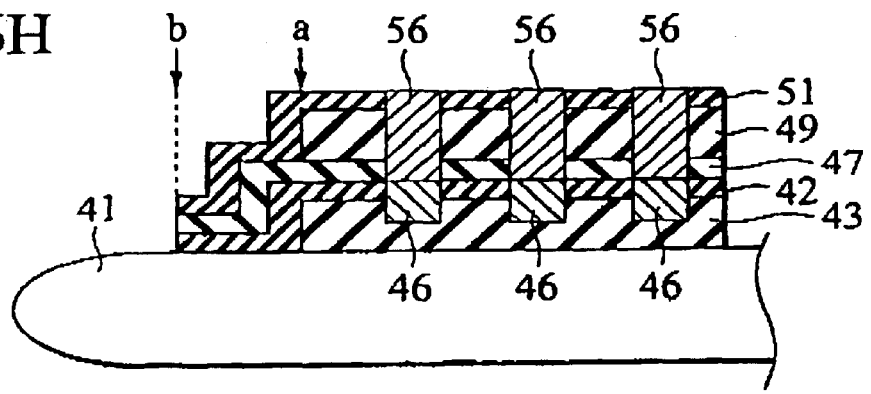

Next, as illustrated in FIG. 6H, the resist 54 is removed, and the trenches are filled with a metal (e.g., Al) to form interlevel interconnects 56. The surface of the metal layer is evened by CMP. Because the PHP edge cut position (i.e., the second edge cut position) "b" for the resist 54 (see FIG. 6G) is located outward of the edge of the second low-k film 49, and because the edge of the first air blocking protection film 47 is also aligned with the second edge cut position "b", the side of the second low-k film 49 are protected, without being exposed to the air, during the formation of the interlevel interconnects 56.

Figure 6I:
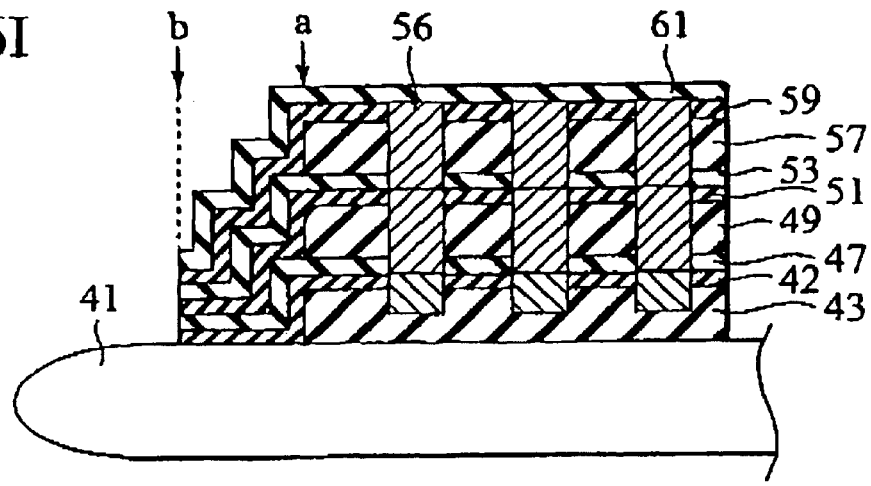

The steps of FIGS. 6E through 6H are repeated to form third-layer interconnection, and a wafer structure 40 is now completed as shown in FIG. 6I.

In the example of the wafer structure 40 shown in FIG. 6I, the edge positions of all the low-k films are aligned with the first edge cut position "a", and the edges of the associated air blocking protection films are aligned with the PEP edge cut position "b". However, the edges of all the low-k films do not necessarily have to precisely align with the fist edge cut position "a". As long as the edge positions of the low-k films are located inward of the PEP edge cut position with at least two of them aligned with the first edge cut position "a", a small amount of misalignment is acceptable. Even with a small misalignment, penetration of air into the low-k films can be efficiently prevented without reducing the effective chip area.

In the second embodiment, the low-k film is protected from process damage, such as CMP or RIE damage, while effectively shutting out the air. Consequently, the reliability of device operation is further improved.

In either embodiment, if further multilayering is continued, the edge cut position of the air blocking protection film is kept as being the second edge cut position that is outward of the edge of the low-k film. The second edge cut position is aligned with a fixed PHP edge cut position, which is defined by exposure of the resist. Accordingly, it is unnecessary to adjust the second edge cut position of the air blocking film for each layer. The effective chip area per wafer is maximized making use of the conventional PHP process.

Although the invention has been described based on specific embodiments, the invention is not limited to these examples but may include many variations and substitutions. For example, instead of using a wet process with a solvent for the edge cut process of the low-k film, laser-beam machining may be carried out to cut the edge of the low-k film. In such a case, process accuracy is improved. In addition, instead of edge cutting of the resist through exposure and development, which is carried out simultaneously with formation of the mask pattern, a separate step of laser-beam machining may be carried out for edge cut of the resist. In this case as well, the edge cut position of the resist is preferably aligned with a fixed position outside the edge of the low-k film. By doing so, it can be guaranteed that the edge of the air blocking protection film, which is to be processed using the resist as a mask, is positioned outside the low-k film. The wavelength and energy density of the laser can be suitably selected in compliance with the film thickness and the material to be processed (for example, low-k material or resist material).

What is claimed is:

1. A wafer on which a semiconductor device is formed, comprising:

a first low dielectric constant film placed over the wafer with an edge thereof located at a first position along a circumference of the wafer;

a protection film placed on the first low dielectric constant film with an edge thereof located at a second position that is outside the first position; and a second low dielectric constant film placed over the protection film with an edge thereof located at the first position.

2. The wafer according to claim 1, wherein the low dielectric constant film has a specific dielectric constant smaller than 3.

3. The wafer according to claim 1, wherein the protection film has a gas permeability lower than that of the first low dielectric constant film.

4. The wafer according to claim 1, wherein the protection-film is a CVD film made of a material selected from the group consisting of SiN, SiC, SiO$_2$, SiOC, SiOF and SiON.

5. The wafer according to claim 1, further comprising:

a cover film placed between the first low dielectric constant film and the protection film with an edge thereof located at the second position.

6. The wafer according to claim 5, wherein the cover film is SiO$_2$ film.

7. The wafer according to claim 1, further comprising:

an interconnect buried in the first low dielectric constant film.

8. The wafer according to claim 7, wherein the interconnect is made of Cu material.

9. The wafer according to claim 1, further comprising:
an interconnect penetrated through the first low dielectric constant film and the protection film.

10. The wafer according to claim 1, wherein the low dielectric constant film is made of a material selected from the group consisting of methylsiloxane, polymethylsioloxane, and hydrogensilsesquixane.

11. A wafer on which a semiconductor device is formed, comprising:
a plurality of low dielectric constant films deposited over the wafer, each dielectric constant films having an edge position, and at least two of the edge positions of the low dielectric constant films being approximately aligned with one another; and
protection films covering each of the low dielectric constant films with an edge thereof positioned at a substantially fixed position located outside the edge position of the associated low dielectric constant film.

12. The wafer according to claim 11, wherein the low dielectric constant film has a specific dielectric constant smaller than 3.

13. The wafer according to claim 11, wherein the protection film has a gas permeability lower than that of the low dielectric constant film.

14. The wafer according to claim 11, wherein the protection film is a CVD film made of a material selected from the group consisting of SiN, SiC, SiOC, SiOF, and SiON.

15. The wafer according to claim 11, further comprising:
cover films placed between each of the low dielectric constant films and each of the protection films with an edge thereof being approximately aligned with the edge of the protection films.

16. The wafer according to claim 15, wherein the cover film is $SiO_2$ film.

17. The wafer according to claim 11, further comprising:
an interconnect buried in any of the low dielectric constant films.

18. The wafer according to claim 11, wherein the interconnect is made of Cu material.

19. The wafer according to claim 11, further comprising:
an interconnect penetrated through at least of one of the low dielectric constant films and one of the protection films.

20. The wafer according to claim 11, wherein the low dielectric constant film is made of a material selected from the group consisting of methylsiloxane, polymethylsiloxane, and hydrogensilsesquixane.

* * * * *